US010680587B2

(12) United States Patent
Narwal et al.

(10) Patent No.: US 10,680,587 B2
(45) Date of Patent: Jun. 9, 2020

(54) RC OSCILLATOR WATCHDOG CIRCUIT

(71) Applicant: STMicroelectronics International N.V., Schiphol (NL)

(72) Inventors: Rajesh Narwal, Greater Noida (IN); Pravesh Kumar Saini, Greater Noida (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 16/027,762

(22) Filed: Jul. 5, 2018

(65) Prior Publication Data

US 2020/0014372 A1 Jan. 9, 2020

(51) Int. Cl.
| | |
|---|---|
| H03K 3/0231 | (2006.01) |
| H03K 4/502 | (2006.01) |
| H03K 5/19 | (2006.01) |
| H03K 3/011 | (2006.01) |

(52) U.S. Cl.
CPC ........... *H03K 3/0231* (2013.01); *H03K 3/011* (2013.01); *H03K 4/502* (2013.01); *H03K 5/19* (2013.01)

(58) Field of Classification Search
CPC ........ H03K 3/0231; H03K 4/50; H03K 4/501; H03K 4/502; H03K 3/014; H03K 5/19; G06F 11/1604
See application file for complete search history.

(56) References Cited

U.S. PATENT DOCUMENTS

| | | |
|---|---|---|
| 5,565,819 A | 10/1996 | Cooper |
| 5,594,388 A | 1/1997 | O'Shaughnessy et al. |
| 6,668,334 B1 * | 12/2003 | Abel ................... H03K 5/1515 327/20 |
| 6,707,320 B2 * | 3/2004 | Trivedi ...................... G06F 1/04 327/18 |
| 6,943,634 B2 * | 9/2005 | Sekimoto ................ H03K 5/19 327/292 |

(Continued)

FOREIGN PATENT DOCUMENTS

JP   H0794942 A   4/1995

OTHER PUBLICATIONS

EPO Search Report and Written Opinion for co-pending EP Appl. No. 19184330.9 dated Nov. 20, 2019 (11 pages).

*Primary Examiner* — Ryan Johnson
(74) *Attorney, Agent, or Firm* — Crowe & Dunlevy

(57) ABSTRACT

An RC oscillator generates a periodic trigger signal, and a clock generator generates clock edges in response. A stuck-at-fault detection circuit detects a stuck-at-logic state of the periodic trigger signal and causes the RC oscillator to reset and causes a change in logic state of the periodic trigger signal. The RC oscillator includes first and second comparison circuits, a logic circuit receiving output from the first and second comparison circuits and generating the periodic trigger signal, and a clock generation circuit generating a clock signal therefrom. The stuck-at-fault detection circuit includes a capacitive node, charge circuitry charging the capacitive node based upon the periodic trigger signal, discharge circuitry discharging the capacitive node based upon the periodic trigger signal, and triggering circuitry asserting a reset signal to cause the RC oscillator to reset when the charge on the capacitive node indicates a stuck-at-logic state of the periodic trigger signal.

19 Claims, 7 Drawing Sheets

(56) References Cited

U.S. PATENT DOCUMENTS

| | | | |
|---|---|---|---|
| 7,498,848 B2* | 3/2009 | Wadhwa | G01R 31/31725 327/18 |
| 8,456,243 B2* | 6/2013 | Aleman | H03B 5/36 331/16 |
| 8,860,517 B2 | 10/2014 | Giacomini | |
| 2007/0188904 A1 | 8/2007 | Tsuyama | |
| 2011/0320852 A1 | 12/2011 | Tsai | |
| 2015/0234420 A1* | 8/2015 | Lin | G06F 1/08 327/292 |
| 2016/0218671 A1 | 7/2016 | Jun et al. | |
| 2018/0054163 A1 | 2/2018 | Chen et al. | |

* cited by examiner

RC OSCILLATOR WATCHDOG CIRCUIT

TECHNICAL FIELD

This disclosure is related to the field of RC oscillator circuits, and in particular, to a watchdog circuit for RC oscillators that detects incorrect operation of an RC oscillator circuit so that a reset of the RC oscillator circuit can be triggered.

BACKGROUND

A system on a chip (SoC) cannot begin its startup process until the SoC receives a clock signal. During normal operation, a SoC typically receives its clock signal from a crystal oscillator. However, the startup time of a crystal oscillator is relatively slow, being on the order of milliseconds. So as to reduce total device startup time, an RC oscillator is typically used to provide a clock signal for the SoC to use during its startup process, as the startup time of the RC oscillator is relatively quick, on the order of microseconds.

A generic RC oscillator 50 for use for such purposes is now described with reference to FIG. 1. The RC oscillator 50 includes a SR flip flop 56 having a set input S, a reset input R, a non-inverting output Q, and an inverting output Qbar. Comparator 52 provides output to the set input S, while comparator 54 provides output to the reset input R.

A current generator 51 generates a bias current Ibias. Resistor R1 is coupled between the current generator 51 and the non-inverting input of the comparator 52, while resistor R2 is coupled between the current generator 51 and the non-inverting input of the comparator 54. A reference voltage Vref is coupled to the inverting inputs of the comparators 52 and 54. Capacitor C1 is coupled between the non-inverting input of the comparator 52 and ground, while capacitor C2 is coupled between the non-inverting input of the comparator 54 and ground. A switch S1 selectively shunts capacitor C1 to ground in response to assertion of the non-inverting output Q of the SR flip flop 56, while switch S2 selectively shunts capacitor C2 to ground in response to assertion of the inverting output Qbar of the flip flop 56.

In operation, assuming an initial condition of Q being low (and thus the clock CK generated by the RC oscillator 50 is low), Qbar would be high. Q being low opens switch S1 resulting in capacitor C1 being charged by the bias current Ibias, while Qbar being high results in switch S2 closing causing capacitor C2 to discharge to ground.

When the voltage across capacitor C1 rises to be equal to the reference voltage Vref, the comparator 52 will assert its output, causing the SR flip flop 56 to set, asserting Q and deasserting Qbar. This in turn causes switch S1 to close to discharge capacitor C1, and switch S2 to open to charge capacitor C2. When the voltage across capacitor C2 rises to be equal to Vref, the comparator 54 will assert its output, resetting the SR flip flop 56 to the state initially discussed.

This repeated operation yields a clock signal CK at the non-inverting output Q of the SR flip flop 56 that, provided the values of R1 and R2 are the same and the values of C1 and C2 are the same, is a square wave.

An issue arises if the SR flip flop 56 fails to transition when it should, due to errors caused by process variation in the formation of the components, for example. If this happens, the RC oscillator 50 becomes stuck, and ceases to generate the square wave, resulting in failure of startup operations of a SoC to which it is providing the clock signal CK.

Therefore, further development into the area of RC oscillators is needed so as to be able to detect these errors and correct them.

SUMMARY

A first aspect disclosed herein is a circuit that includes a RC oscillator and an oscillator fault detection circuit. The RC oscillator includes a first comparison circuit, a second comparison circuit, a logic circuit receiving output from the first and second comparison circuits as input and generating a logic output signal, and a clock generation circuit generating a clock signal as a function of the logic output signal. The oscillator fault detection circuit includes a capacitive node, charge circuitry configured to selectively charge the capacitive node based upon the logic output signal, discharge circuitry configured to selectively discharge the capacitive node based upon the logic output signal, and triggering circuitry configured to assert a reset signal when the charge on the capacitive node indicates a fault with the RC oscillator.

The discharge circuitry fails to discharge the capacitive node to a lower threshold when the logic output signal transitions in a pattern indicating proper operation of the RC oscillator. The charge on the capacitive node being above the lower threshold indicates proper operation of the RC oscillator.

The discharge circuitry begins to discharge the capacitive node to below a lower threshold when the logic output signal fails to transition in a pattern indicating proper operation of the RC oscillator. The charge on the capacitive node being below the lower threshold indicates a fault with the RC oscillator.

The charge circuitry maintains the capacitive node above a lower threshold when the logic output signal transitions in a pattern indicating proper operation of the RC oscillator. Charge on the capacitive node being above an upper threshold indicates proper operation of the RC oscillator.

The reset signal serves to reset the RC oscillator such that the RC oscillator returns to proper operation. The charge circuitry charges the capacitive node to back above the lower threshold when the logic output signal returns to a reset state after the RC oscillator has been reset by the reset signal, thereby resulting in the triggering circuitry deasserting the reset signal.

The charge circuitry does not charge the capacitive node when the logic output signal fails to transition in a pattern indicating proper operation of the RC oscillator. The charge circuitry may include an inverter, and the discharge circuitry may also utilize the inverter.

The charge circuitry further may include a first latch, and the discharge circuitry may include a second latch.

The triggering circuitry may include a Schmitt trigger.

The capacitive node may be coupled to at least one field effect transistor (FET) configured as a capacitor.

The first comparison circuit may include a first comparator, and the second comparison circuit may include a second comparator, while the logic circuit may include an OR gate.

The reset signal may serve to reset the RC oscillator such that the RC oscillator returns to proper operation.

Another aspect disclosed herein is directed to a circuit comprised of an RC oscillator and an oscillator fault detection circuit. The RC oscillator includes a first comparison circuit, a second comparison circuit, a logic circuit receiving output from the first and second comparison circuits as input and generating a logic output signal, and a clock generation circuit generating a clock signal as a function of the logic output signal. The oscillator fault detection circuit includes a capacitive node, an inverter coupled to receive the logic output signal and provide output to the capacitive node, a Schmitt trigger having an input coupled to the capacitive node, and at least one inverter coupled between an output of the Schmitt trigger and an output of the oscillator fault.

The oscillator fault detection circuit may include a buffer coupled between the logic output signal and the inverter, a first PMOS transistor having a source coupled to a supply node, a drain, and a gate coupled to the logic output signal, and a second PMOS transistor having a source coupled to the drain of the first PMOS transistor, a drain coupled to the capacitive node, and a gate coupled to the output of the Schmitt trigger.

The oscillator fault detection circuit may also include a first NMOS transistor having a drain coupled to the capacitive node, a source, and a gate coupled to the output of the Schmitt trigger, and a second NMOS transistor having a drain coupled to the source of the first NMOS transistor, a source coupled to ground, and a gate coupled to the logic output signal.

The oscillator fault detection circuit may also include a first PMOS transistor having a source and drain coupled to a supply node and a gate coupled to the capacitive node, and a second PMOS transistor having a source and drain coupled to ground and a gate coupled to the capacitive node.

Another aspect disclosed herein is a circuit including an RC oscillator configured to generate a periodic trigger signal, a clock generator configured to generate clock edges in response to the periodic trigger signal, and a stuck at fault detection circuit. The stuck at fault detection circuit is configured to detect a stuck at logic state of the periodic trigger signal and in response thereto cause the RC oscillator to reset and cause a change in logic state of the periodic trigger signal.

The RC oscillator may include a first comparison circuit, a second comparison circuit, a logic circuit receiving output from the first and second comparison circuits as input and generating the periodic trigger signal, and a clock generation circuit generating a clock signal as a function of the periodic trigger signal.

The stuck at fault detection circuit may include a capacitive node, charge circuitry configured to selectively charge the capacitive node based upon the periodic trigger signal, discharge circuitry configured to selectively discharge the capacitive node based upon the periodic trigger signal, and triggering circuitry configured to assert a reset signal to cause the RC oscillator to reset when the charge on the capacitive node indicates a stuck at logic state of the periodic trigger signal.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
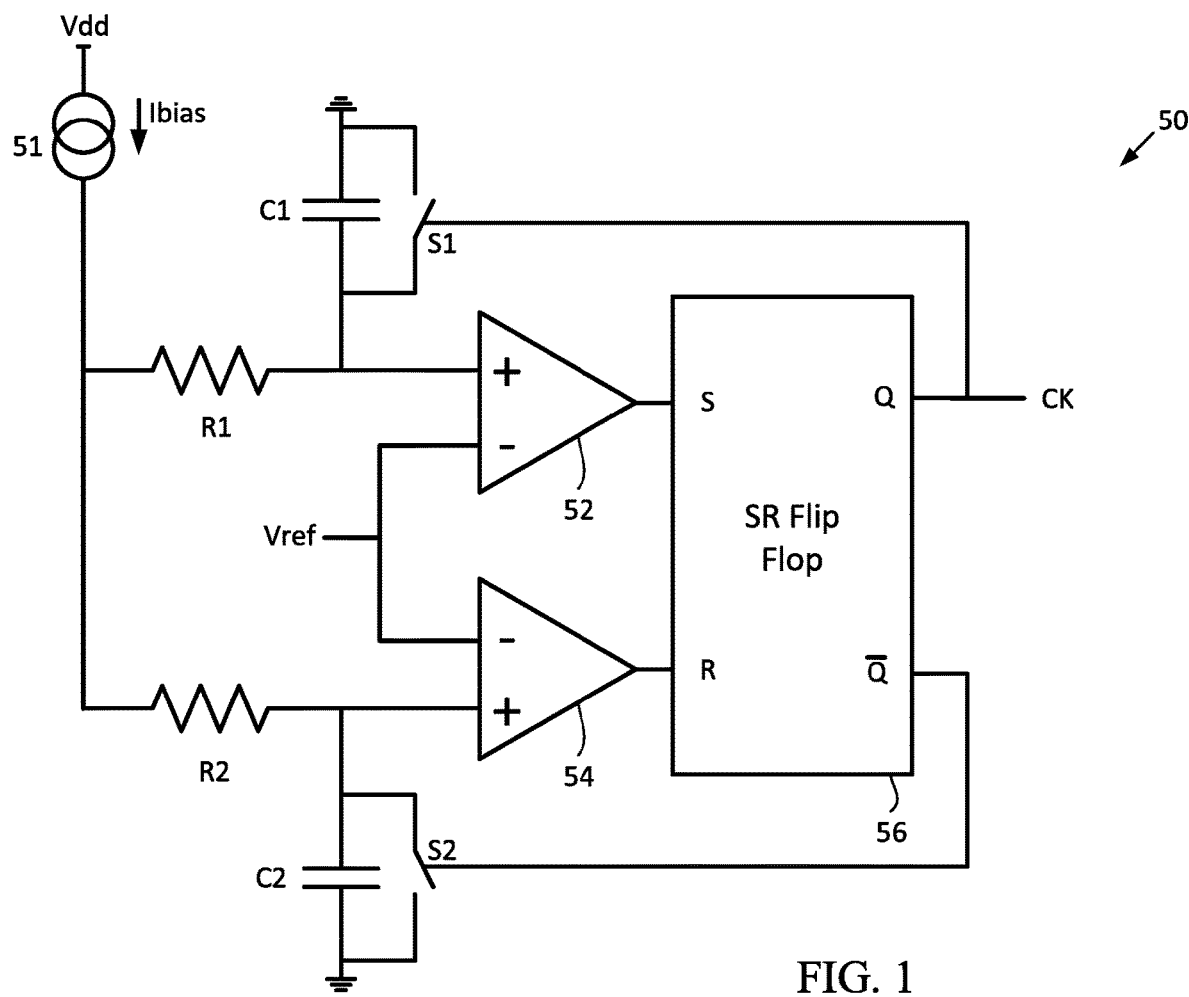
FIG. 1 is a schematic block diagram of a known RC oscillator in accordance with the prior art.
Figure 2:
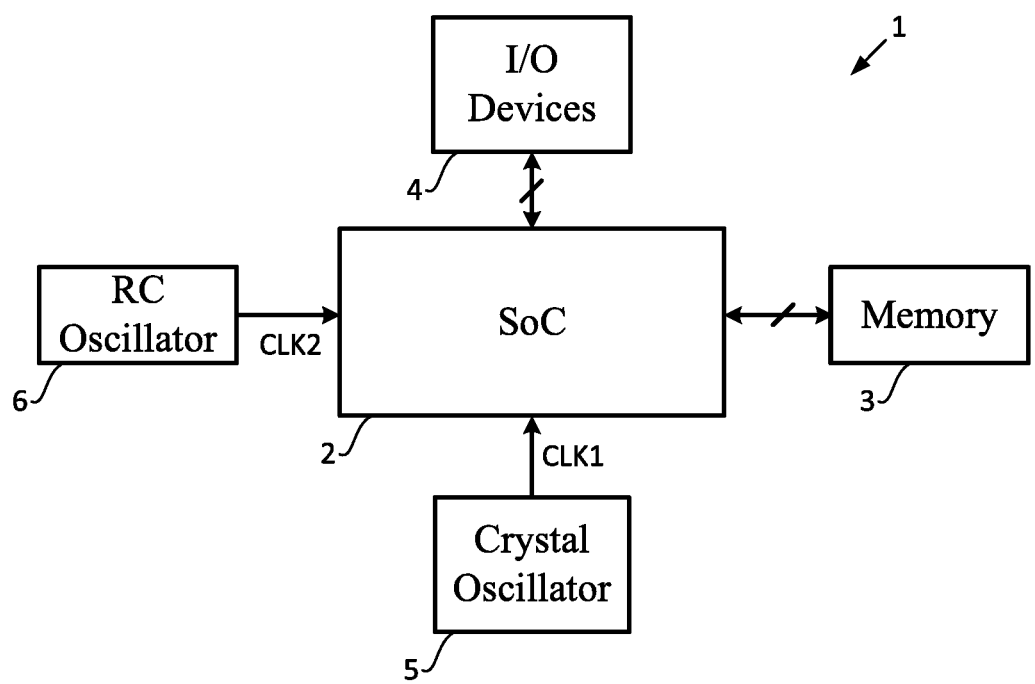
FIG. 2 is a block diagram of an electronic system including a system on a chip that receives its clock signal from a crystal oscillator during normal operations but that receives a clock signal from a RC oscillator during startup operations.

With reference to FIG. 2, an electronic system 1 including a system on a chip (SoC) 2 is now described. The SoC 2 is coupled to a memory 3, input/output (I/O) devices 4, a crystal oscillator 5, and a RC oscillator 6. When the electronic system 1 is in a powered state during normal operations, it operates based upon a clock signal CLK1 received from a crystal oscillator 5.

However, when the electronic system 1 is powered up from a powered down state, the SoC 2 requires a clock signal CLK2 to begin its own startup operations. The crystal oscillator 5 takes a relatively long time (on the order of milliseconds) to begin producing the clock signal CLK1 after power up of the electronic system 1. Therefore, immediately after power up of the electronic system 1, the RC oscillator 6 is used to produce a clock signal CLK2 for the SoC 2 because the RC oscillator 6 is able to produce the clock signal CLK2 in a short period of time (on the order of microseconds) after power up.

As explained above, however, standard RC oscillators have undesirable drawbacks that are to be avoided. Therefore, the following design for a RC oscillator 6 has been developed and will be described with reference to FIG. 3.

The RC oscillator 6 includes a current source Gp generating a bias current Ibias. This bias current Ibias is received at the input of current mirror 7. The output of current mirror 7 draws current Irif into it, and current Irif is proportional to the bias current Ibias. The current mirror 7 includes (NMOS) transistor T1 having its drain acting as the input to the current mirror 7, its source coupled to ground, and its gate coupled to its drain. The current mirror 7 includes (NMOS) transistor T2 having its drain acting as the output to the current mirror 7, its source coupled to ground, and its gate coupled to the gate of transistor T1.

Current Irif is drawn from the input of current mirror 8. Current mirror 8 includes (PMOS) transistor T3 having its source coupled to supply node Vdd, its drain acting as the input to the current mirror 8, and its gate coupled to its drain. (PMOS) transistor T4 has its source coupled to the supply node Vdd, its drain coupled to node 14 to provide output current I1, and its gate coupled to the gate of transistor T3. (PMOS) transistor T5 has its source coupled to the supply node Vdd, its drain coupled to node 15 to provide output current I2, and its gate coupled to the gate of transistor T3. (PMOS) Transistor T6 has it source coupled to the supply node Vdd, its drain coupled to node 28 to provide output current I3, and its gate coupled to the gate of transistor T3. Thus, the drains of transistor T4, T5, and T6 form the outputs of the current mirror 8.

Multiplexer 13 has inputs coupled to nodes 14, 15, and 28 to receive the currents I1, I2, and I3 respectively. The multiplexer 13 has outputs coupled to nodes 16, 17, and 18. Resistor R is coupled between node 18 and ground. Capacitor C3 is coupled between node 17 and ground, and capacitor C4 is coupled between node 16 and ground. The multiplexer 13 is controlled by the control signals Ssw received from control circuit 21.

Comparator 80 has an inverting terminal receiving a reference voltage Vref from node 18, a non-inverting terminal receiving voltage V1 from node 17, and an output Sc1 coupled to OR gate 84. Comparator 81 has an inverting terminal receiving the reference voltage Vref from node 18, a non-inverting terminal receiving the voltage V2 from node 16, and an output Sc2 coupled to OR gate 84. Comparator 80 is enabled by the comparator enable signal Scomp, and comparator 81 is enabled by the inverse of the comparator enable signal (generated by passing Scomp through inverter 11). OR gate 84 has its output, producing output signal Sc, coupled to the inputs of control circuit 21 and clock generator 22. Control circuit 21 generates the control signals Ssw as output, and clock generator 22 generates the clock signal CLK2 as output.

In operation, the current mirror 7 mirrors current Ibias, multiplied by a mirroring factor, to draw current Irif from the input of current mirror 8. The current mirror 8 then mirrors current Irif from its outputs as currents I1, I2, and I3, each being Irif multiplied by a respective mirroring factor.

The multiplexer 13 is switched between different phases. In each phase, only one of the capacitors C3 or C4 is supplied by the multiplexer 13, while the other of the capacitors C3 or C4 is allowed to discharge. For example, in a first phase, capacitor C3 is charged while capacitor C4 is allowed to discharge; in a second phase, capacitor C4 is charged while capacitor C3 is allowed to discharge; in a third phase, capacitor C3 is charged while capacitor C4 is allowed to discharge; and in a fourth phase, capacitor C4 is charged while capacitor C3 is allowed to discharge. In each phase where capacitor C3 is charged, one of the currents I1, I2, and I3 is coupled by the multiplexer 13 to the capacitor C3. Likewise, in each phase where the capacitor C4 is charged, one of the currents I1, I2, and I3 is coupled by the multiplexer 13 to the capacitor C4.

When the voltage V1 at node 17 becomes equal to Vref as the capacitor C3 is charged by one of the currents I1, I2, and I3, the comparator 80 asserts its output Sc1. This results in the OR gate 84 asserting its output signal Sc to the control circuit 21 and the clock generator 22. Similarly, when the voltage V2 at node 16 becomes equal to Vref as the capacitor C4 is charged by one of the currents I1, I2, and I3, the comparator 81 asserts its output Sc2, resulting in the OR gate 84 asserting its output signal Sc to the control circuit 21 and the clock generator 22. The control circuit 21 generates the control signals Ssw and the comparator enable signal Scomp based on the signal Sc, and the clock generator 22 generates the clock signal CLK2 based on the signal Sc.

When the RC oscillator 6 is in a powered down state, both of the outputs Sc1 and Sc2 of the comparators 81 and 82 remain deasserted. When the RC oscillator 6 is powered on, Scomp is asserted, and the comparator 80 is enabled while comparator 81 remains disabled. This results in the comparator 80 asserting its output Sc1 when the voltage V1 becomes equal to the reference voltage Vref. This results in a rising edge of the signal Sc, and in turn, the clock generator circuit 22 generating a rising edge of the clock signal CLK2. At the same time, this rising edge of the signal Sc results in the control circuit 21 flipping the logic level of Scomp and altering the control signal Ssw to the multiplexer 13.

Altering the control signal Ssw to the multiplexer 13 changes its configuration so that C3 begins to discharge (V1 falls) and so that C4 begins to charge (V2 rises). When the logic level of Scomp is flipped, the comparator 80 is disabled, and the comparator 81 is enabled. When the comparator 81 is enabled, Vref will be greater than V2, so Sc2 will be deasserted.

V2 rises until it is equal to Vref, at which point the comparator 81 asserts its output Sc2, resulting in a next rising edge of the signal Sc being generated, and in turn, the clock generator circuit 22 generating a falling edge of the clock signal CLK2. At the same time, this rising edge of the signal Sc results in the control circuit 21 altering the control signal Ssw to the multiplexer 13, which changes its configuration so that C4 begins to discharge (V2 falls), and so that C3 begins to charge (V1 rises).

The repetition of the above steps repeats so as to generate the clock signal CLK2.

Further specifics of this operation may be found in U.S. Pat. No. 8,860,517, entitled "Oscillator circuit and electronic circuit comprising the electronic circuit", the contents of which are hereby incorporated by reference in their entirety.

Figure 3:
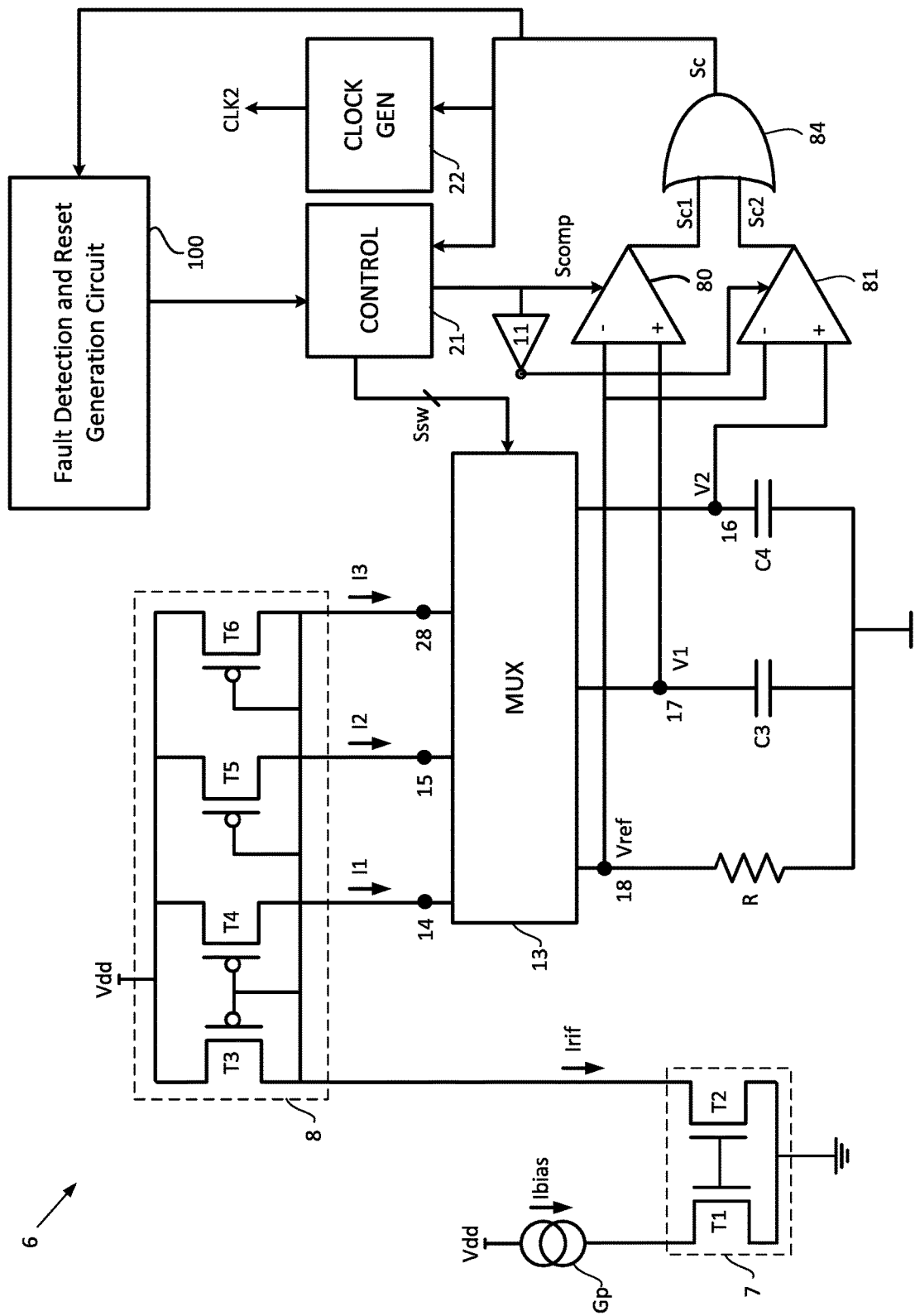
FIG. 3 is a schematic block diagram of the RC oscillator of FIG. 2.
Figure 6:
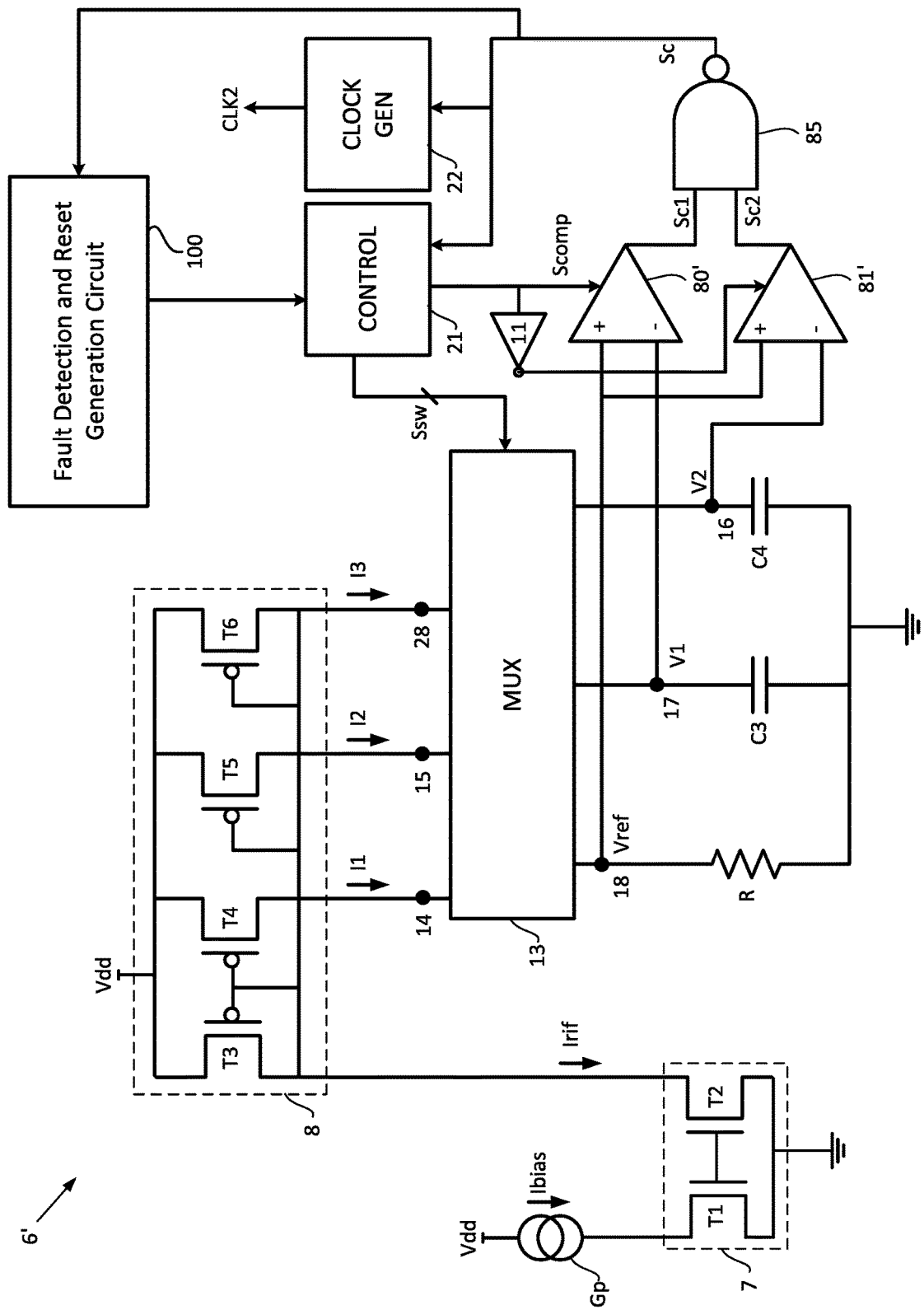
FIG. 6 is a schematic block diagram of an alternate embodiment of the RC oscillator of FIG. 2.

An alternative arrangement for a RC oscillator 6' is shown in FIG. 6. The difference as compared to the RC oscillator 6 of FIG. 3 is in the comparators 80' and 81', and that instead of the OR gate 84 receiving Sc1 and Sc2 there is a NAND gate 85 receiving those signals. Here, the comparator 80' has its non-inverting terminal coupled to Vref and its inverting terminal coupled to V1, while the comparator 81' has its non-inverting terminal coupled to Vref and its inverting terminal coupled to V2.

When the RC oscillator 6' is in a powered down state, both of the outputs Sc1 and Sc2 of the comparators 81' and 82' remain deasserted. When the RC oscillator 6' is powered on, Scomp is asserted, and the comparator 80' is enabled while comparator 81' remains disabled. Since initially Vref will be greater than V1, the comparator 80' will default to asserting its output Sc1 when initially enabled. When the voltage V1 becomes equal to the reference voltage Vref, the comparator 80' will deassert its output Sc1. Due to the NAND logic from NANDF gate 85, this results in a rising edge of the signal Sc, and in turn, the clock generator circuit 22 generating a rising edge of the clock signal CLK2. At the same time, this rising edge of the signal Sc results in the control circuit 21 flipping the logic level of the Scomp signal, and altering the control signal Ssw to the multiplexer 13. In response, the multiplexer changes its configuration so that C3 begins to discharge (V1 falls) and C4 begins to charge (V2 rises). When the logic level of Scomp is flipped, the comparator 80' is disabled, and the comparator 81' is enabled. When the comparator 81' is enabled, Vref will be greater than than V2, so Sc2 will be asserted.

V2 rises until it is equal to Vref, at which point the comparator 81' deasserts its output Sc2, resulting in a next rising edge of the signal Sc being generated, and in turn, the clock generator circuit 22 generating a falling edge of the clock signal CLK2. At the same time, this rising edge of the signal Sc results in the control circuit 21 altering the control signal Ssw to the multiplexer 13, which changes its configuration so that C4 begins to discharge until Sc2 is ultimately re-asserted, and so that C3 begins to charge. The repetition of the above steps repeats so as to generate the clock signal CLK2.

With respect to either the RC oscillator 6 or the RC oscillator 6', if the edges of the signal Sc are not properly generated, then the clock generator 22 will not change the state of the clock signal CLK2, and the clock signal CLK2 becomes stuck in one state. This results in the startup operations of the SoC 2 failing.

Figure 4:
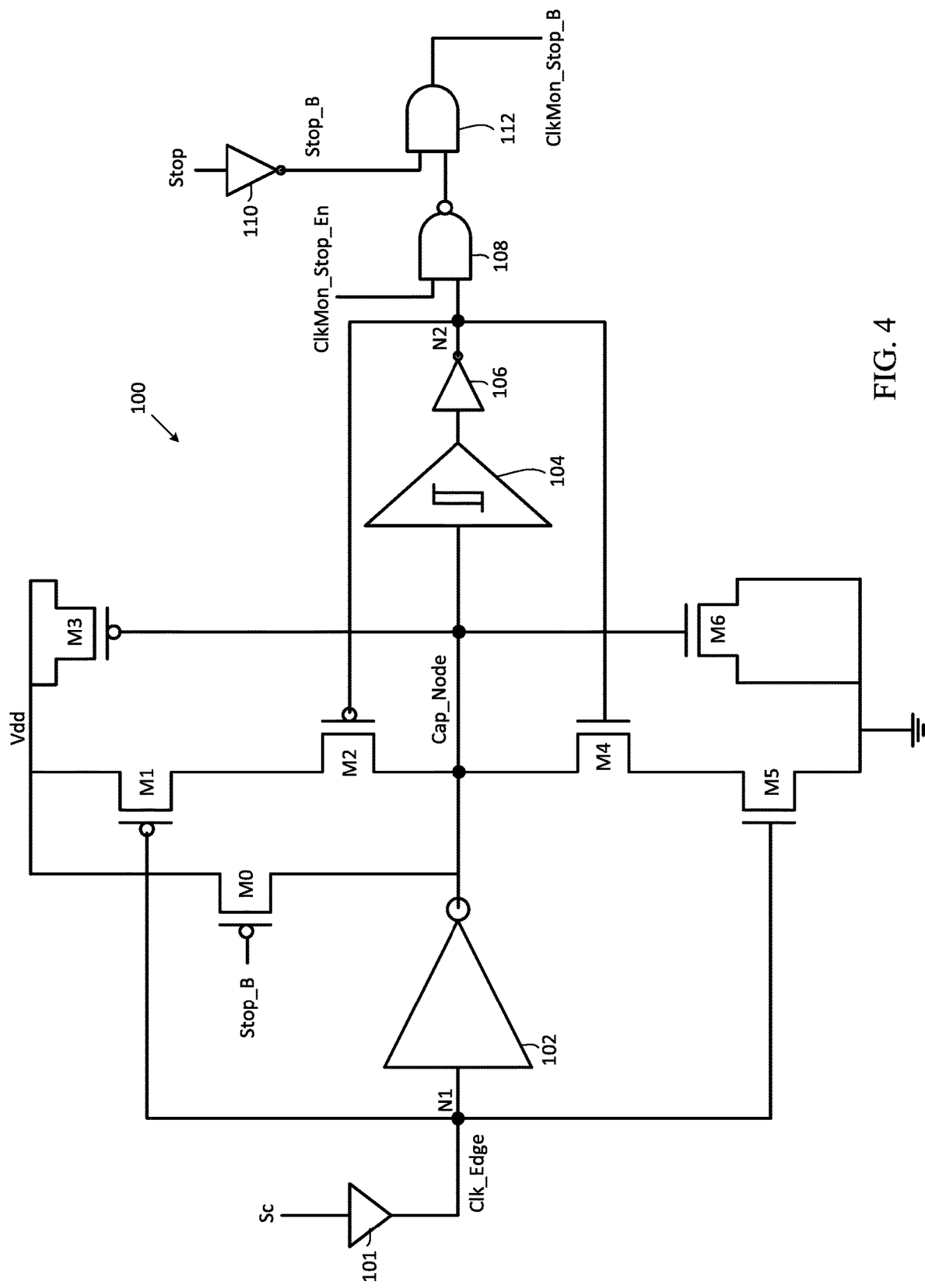
FIG. 4 is a schematic block diagram of the fault detection and reset generation circuit of FIG. 3.

To detect a fault in the RC oscillator 6 or 6' where the edges of Sc are not properly generated, a fault detection and reset generation circuit 100 is used. Details of the fault detection and reset generation circuit 100 are now given with additional reference to FIG. 4.

The fault detection and reset generation circuit 100 includes a buffer 101 receiving the signal Sc, and buffering that signal to produce the Clk_Edge signal to node N1. An inverter 102 is coupled to node N1 to receive the Clk_Edge signal as input, and provides output to a capacitive node Cap_Node.

A (PMOS) transistor M0 has its source coupled to the supply node Vdd, its drain coupled to the capacitive node Cap_Node, and its gate biased by signal Stop_B. Note that Stop_B is a power down signal.

A (PMOS) transistor M1 has its source coupled to the supply node Vdd, a drain, and its gate coupled to node N1 to be biased by the Clk_Edge signal. (PMOS) transistor M2 has its source coupled to the drain of transistor M1, its drain coupled to the capacitive node Cap_Node, and a gate coupled to node N2. An (NMOS) transistor M4 has its drain coupled to the capacitive node Cap_Node, a source, and a gate coupled to node N2. An (NMOS) transistor M5 has its drain coupled to the source of transistor M4, its source coupled to ground, and its gate coupled to node N1 to be biased by the Clk_Edge signal.

A (PMOS) transistor M3 has its source and drain coupled to the supply node Vdd and its gate coupled to the capacitive node Cap_Node. Thus, the source and drain of the transistor M3 act as one plate of a capacitor and the gate of the transistor M3 acts as the other plate of the capacitor. Similarly, a (PMOS) transistor M6 has its source and drain coupled to the ground node and its gate coupled to the capacitive node Cap_Node. Likewise here, the source and drain of the transistor M6 act as one plate of a capacitor and the gate of the transistor acts as the other plate of the capacitor.

A Schmitt trigger 104 has its input coupled to the capacitive node Cap_Node, and provides its output to node N2 through inverter 106. A NAND gate 108 has inputs coupled to node N2 and to the CLkMon_Stop_En signal. Note that the ClkMon_Stop_En signal acts as an enable signal for the NAND gate 108.

An AND gate 112 has an input coupled to the output of the NAND gate 108, and to the output of inverter 110. The inverter 110 receives a Stop signal, inverts it, and passes the inverted Stop signal to the AND gate 112. Note that the Stop signal, when high, serves to pull the output of the AND gate 112 low. The ClkMon_Stop_B signal is generated at the output of the AND gate 112.

In operation, when the signal Sc is low, the inverter 102 charges the capacitive node Cap_Node to a logic high. When Sc transitions high, and the inverter 102 then works to discharge the capacitive node Cap_Node over time.

During correct operation of the RC oscillator 6, the signal Sc (and therefore Clk_Edge) only stays at a logic high for a short period of time during a single period of the clock CLK2, and remains at a logic low the remainder of the period of the clock CLK2. However, if the error condition described above occurs in which the signal Sc fails to transition, the signal Sc will remain at a logic high.

This results in the inverter 102 discharging the capacitive node Cap_Node below a threshold such that the Schmitt trigger 104 trips and asserts its output as a logic high. This ultimately results in the AND gate 112 generating the ClkMon_Stop_B signal as a logic zero, generating a reset signal for the RC oscillator 6.

The reset signal for the RC oscillator 6 serves to reset the signal Sc to a logic low. As explained above, the effect on the fault generation and reset generation circuit 100 of the signal Sc being at a logic low is to begin to charge the capacitive node Cap_Node. Once the voltage at the capacitive node Cap_Node is equal to the threshold, the Schmitt trigger triggers and asserts its output as a logic low. This ultimately results in the ClkMon_Stop_B signal being asserted by the AND gate 112 at a logic high, and the restart of the RC oscillator 6 into a normal mode of operation.

Note that transistor M1 and M2 are arranged as a latch that serves to help the inverter 102 pull the capacitive node Cap_Node high while the signal Sc is low, and that transistor M4 and M5 are likewise arranged as a latch that serves to help the inverter 102 pull the capacitive node Cap_Node low while the signal Sc is high.

In greater detail, transistor M1 is enabled when Clk_Edge is at a logic low. The feedback from transistor M2 forms the latch, pulling the capacitive node Cap_Node high when node N2 is at a logic low. Transistor M5 is enabled when Clk_Edge is at a logic high. The feedback from transistor M4 forms the latch, pulling the capacitive node Cap_Node low when node N2 is at a logic low. Therefore, the latch is dependent on the states of Clk_Edge and N2.

Figure 5:
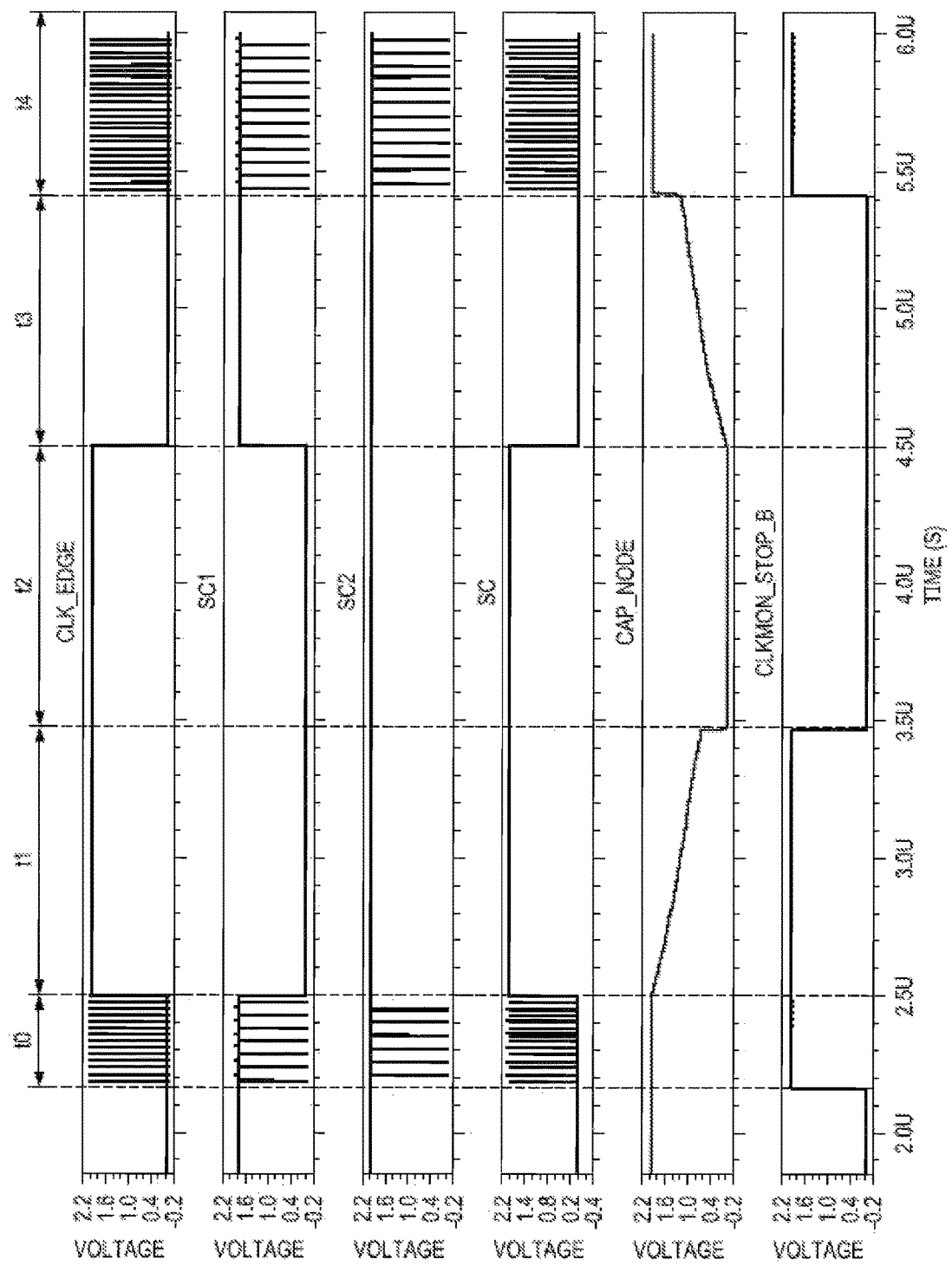
FIG. 5 is a timing diagram of the fault detection and reset generation circuit of FIG. 4 in operation.

Operation of the fault detection and reset generation circuit 100 can be seen in the timing diagram of FIG. 5. It can be seen that during time period t0, the RC oscillator 6 is operating properly, and comparators 80 and 81 are triggering Sc1 and Sc2 properly, with both Sc1 and Sc2 only remaining briefly at logic lows. It can also be seen that the OR gate 84 is transitioning properly, with the signal Sc remaining only briefly at logic highs. Accordingly, since the signal Sc is only briefly at logic highs, the capacitance of the capacitance node Cap_Node filters those spikes, so the capacitive node Cap_Node remains at a logic high during period t0. Accordingly, the Schmitt trigger 104 does not trip, and its output remains deasserted at a logic low, resulting in the ClkMon_Stop_B signal remaining at a logic high, as seen during period t0. Thus, during time period t0, the clock signal CLK2 runs properly.

At the beginning of time period t1, however, operation of the RC oscillator 6 becomes stuck, with the output Sc1 of the comparator 80 becoming stuck at a logic low, and the output Sc2 of the comparator 81 becoming stuck at a logic high. Resultingly, the output signal Sc from the OR gate 84 becomes stuck at a logic high, and the clock signal CLK2 is stuck at a logic high.

As explained, this results in the inverter 102 and latch formed from transistors M4-M5 discharging the capacitive node Cap_Node until, at the beginning of time period t2, the Schmitt trigger 104 resultingly trips and asserts its output at a logic high, resulting in the ClkMon_Stop_B signal being pulled to a logic low. The ClkMon_Stop_B signal remains at a logic low during time period t2, generating the reset signal for the RC oscillator 6.

The reset signal for the RC oscillator 6 resets the signal Sc to a logic low, and thus, at the beginning of time period t3, the capacitive node Cap_Node begins to be charge up again via the inverter 102 and the latch formed from transistors M1-M2. Once the voltage at the capacitive node Cap_Node is equal to a threshold value at the beginning of time period t4, the Schmitt trigger 104 triggers and asserts its output as a logic low. This results in the ClkMon_Stop_B signal being asserted at a logic high, and the restart of the RC oscillator 6 into a normal mode of operation. Thus, due to the reset, at the beginning of time period t4, the clock signal CLK2 begins to run properly again.

Note that the capacitive node Cap_Node may have equal charge and discharge times, or may in some instances have asymmetric charge and discharge times so as to reduce the wake-up time of the RC oscillator 6.

In some instances, it may be desirable to invert the output of the fault detection and reset generation circuit 100, making the ClkMon_Stop_B signal a high signal when an error is detected.

Figure 7:
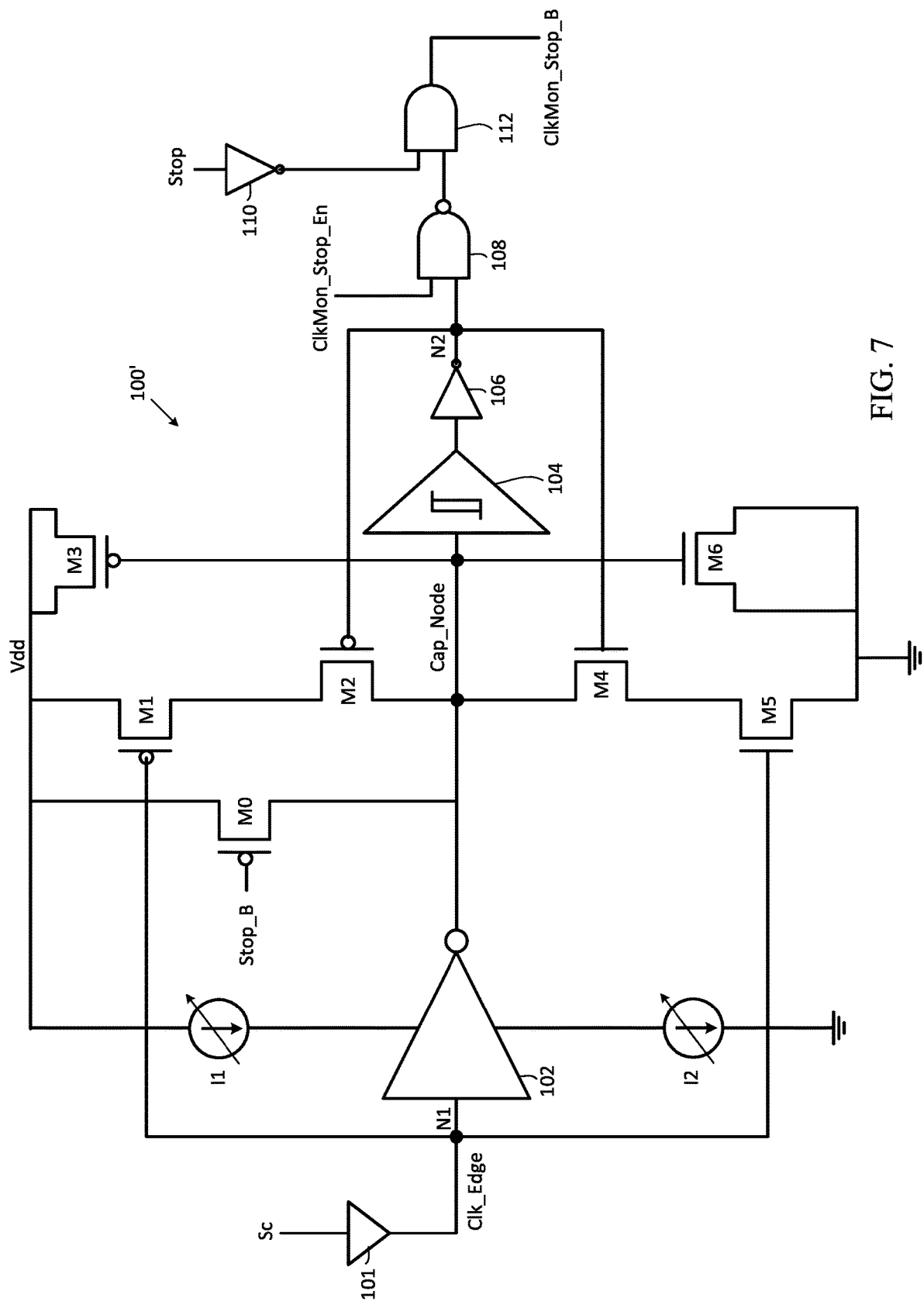
FIG. 7 is a schematic block diagram of an alternate embodiment of the fault detection and reset generation circuit of FIG. 3.

An alternative fault detection and reset generation circuit 100' is shown in FIG. 7. The difference between the fault detection and reset generation circuit 100 of FIG. 4 and the fault detection and reset generation circuit 100' of FIG. 7 is that fault detection and reset generation circuit 100' has its inverter 102 powered through adjustable current sources I1 and I2, which enable control of wake-up and reset times for the fault detection and reset generation circuit 100'.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A circuit, comprising:
    an RC oscillator comprising:
        a first comparison circuit,
        a second comparison circuit,
        a logic circuit receiving output from the first and second comparison circuits as input, and generating a logic output signal, and
        a clock generation circuit generating a clock signal as a function of the logic output signal; and
    an oscillator fault detection circuit comprising:
        a capacitive node,
        charge circuitry configured to selectively charge the capacitive node based upon the logic output signal,
        discharge circuitry configured to selectively discharge the capacitive node based upon the logic output signal, and
        triggering circuitry configured to assert a reset signal when the charge on the capacitive node indicates a fault with the RC oscillator.

2. The circuit of claim 1, wherein the discharge circuitry fails to discharge the capacitive node to a lower threshold when the logic output signal transitions in a pattern indicating proper operation of the RC oscillator; and wherein the charge on the capacitive node being above the lower threshold indicates proper operation of the RC oscillator.

3. The circuit of claim 1, wherein the discharge circuitry begins to discharge the capacitive node to below a lower threshold when the logic output signal fails to transition in a pattern indicating proper operation of the RC oscillator; and wherein the charge on the capacitive node being below the lower threshold indicates a fault with the RC oscillator.

4. The circuit of claim 1, wherein the charge circuitry maintains the capacitive node above a lower threshold when the logic output signal transitions in a pattern indicating proper operation of the RC oscillator; and wherein charge on the capacitive node being above an upper threshold indicates proper operation of the RC oscillator.

5. The circuit of claim 4, wherein the reset signal serves to reset the RC oscillator such that the RC oscillator returns to proper operation; and wherein the charge circuitry charges the capacitive node to back above the lower threshold when the logic output signal returns to a reset state after the RC oscillator has been reset by the reset signal, thereby resulting in the triggering circuitry deasserting the reset signal.

6. The circuit of claim 1, wherein the charge circuitry does not charge the capacitive node when the logic output signal fails to transition in a pattern indicating proper operation of the RC oscillator.

7. The circuit of claim 1, wherein the charge circuitry comprises an inverter; and wherein the discharge circuitry also comprises the inverter.

8. The circuit of claim 1, wherein the charge circuitry further comprises a first latch; and wherein the discharge circuitry further comprising a second latch.

9. The circuit of claim 1, wherein the triggering circuitry comprises a Schmitt trigger.

10. The circuit of claim 1, wherein the capacitive node is coupled to at least one field effect transistor (FET) configured as a capacitor.

11. The circuit of claim 1, wherein the first comparison circuit comprises a first comparator, wherein the second comparison circuit comprises a second comparator, and wherein the logic circuit comprises an OR gate.

12. The circuit of claim 1, wherein the reset signal serves to reset the RC oscillator such that the RC oscillator returns to proper operation.

13. A circuit, comprising:
    an RC oscillator comprising:
        a first comparison circuit,
        a second comparison circuit,
        a logic circuit receiving output from the first and second comparison circuits as input, and generating a logic output signal, and
        a clock generation circuit generating a clock signal as a function of the logic output signal; and
    an oscillator fault detection circuit comprising:
        a capacitive node,
        an inverter coupled to receive the logic output signal and provide output to the capacitive node,
        a Schmitt trigger having an input coupled to the capacitive node, and
        at least one inverter coupled between an output of the Schmitt trigger and an output of the oscillator fault detection circuit.

14. The circuit of claim 13, wherein the oscillator fault detection circuit further comprises a buffer coupled between the logic output signal and the inverter.

15. The circuit of claim 13, wherein the oscillator fault detection circuit further comprises:
    a first PMOS transistor having a source coupled to a supply node, a drain, and a gate coupled to the logic output signal; and
    a second PMOS transistor having a source coupled to the drain of the first PMOS transistor, a drain coupled to the capacitive node, and a gate coupled to the output of the Schmitt trigger.

16. The circuit of claim 13, wherein the oscillator fault detection circuit further comprises:
    a first NMOS transistor having a drain coupled to the capacitive node, a source, and a gate coupled to the output of the Schmitt trigger; and
    a second NMOS transistor having a drain coupled to the source of the first NMOS transistor, a source coupled to ground, and a gate coupled to the logic output signal.

17. The circuit of claim 13, wherein the oscillator fault detection circuit further comprises:
    a first PMOS transistor having a source and drain coupled to a supply node and a gate coupled to the capacitive node; and a second PMOS transistor having a source and drain coupled to ground and a gate coupled to the capacitive node.

18. A circuit, comprising:
an RC oscillator configured to generate a periodic trigger signal;
a clock generator configured to generate clock edges in response to the periodic trigger signal;
a stuck at fault detection circuit configured to detect a stuck at logic state of the periodic trigger signal and in response thereto cause the RC oscillator to reset and cause a change in logic state of the periodic trigger signal;
wherein the RC oscillator comprises:
a first comparison circuit;
a second comparison circuit;
a logic circuit receiving output from the first and second comparison circuits as input, and generating the periodic trigger signal; and
a clock generation circuit generating a clock signal as a function of the periodic trigger signal;
wherein the stuck at fault detection circuit comprises:
a capacitive node;
charge circuitry configured to selectively charge the capacitive node based upon the periodic trigger signal;
discharge circuitry configured to selectively discharge the capacitive node based upon the periodic trigger signal; and
triggering circuitry configured to assert a reset signal to cause the RC oscillator to reset when the charge on the capacitive node indicates a stuck at logic state of the periodic trigger signal.

19. A circuit comprising,
an RC oscillator configured to generate a periodic trigger signal;
a clock generator configured to generate clock edges in response to the periodic trigger signal; and
a stuck at fault detection circuit configured to detect a stuck at logic state of the periodic trigger signal and in response thereto cause the RC oscillator to reset and cause a change in logic state of the periodic trigger signal;
wherein the stuck at fault detection circuit comprises:
a capacitive node;
charge circuitry configured to selectively charge the capacitive node based upon the periodic trigger signal;
discharge circuitry configured to selectively discharge the capacitive node based upon the periodic trigger signal; and
triggering circuitry configured to assert a reset signal to cause the RC oscillator to reset when the charge on the capacitive node indicates a stuck at logic state of the periodic trigger signal.

\* \* \* \* \*